United States Patent
Liao et al.

(10) Patent No.: US 10,994,516 B2
(45) Date of Patent: May 4, 2021

(54) RESIN COMPOSITION, AND PRE-PREG, METAL-CLAD LAMINATE AND PRINTED CIRCUIT BOARD PREPARED USING THE SAME

(71) Applicant: TAIWAN UNION TECHNOLOGY CORPORATION, Chupei (TW)

(72) Inventors: Chih-Wei Liao, Chupei (TW); Hsien-Te Chen, Chupei (TW); Tsung-Hsien Lin, Chupei (TW); Ju-Ming Huang, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 159 days.

(21) Appl. No.: 15/859,829

(22) Filed: Jan. 2, 2018

(65) Prior Publication Data
US 2019/0071548 A1 Mar. 7, 2019

(30) Foreign Application Priority Data

Sep. 7, 2017 (TW) ................................. 106130635

(51) Int. Cl.
  *B32B 15/20* (2006.01)
  *C08L 79/08* (2006.01)
  *H05K 1/03* (2006.01)

(52) U.S. Cl.
  CPC ............ *B32B 15/20* (2013.01); *C08L 79/085* (2013.01); *H05K 1/0373* (2013.01); *B32B 2260/046* (2013.01); *B32B 2457/08* (2013.01); *C08L 2203/16* (2013.01); *C08L 2203/20* (2013.01); *C08L 2205/035* (2013.01); *H05K 1/0346* (2013.01)

(58) Field of Classification Search
  CPC ........... H05K 2201/068; H05K 1/0373; H05K 1/0346; H05K 2201/012; H05K 1/0326; C08J 2335/00; C08J 2435/00; C08J 5/24; C08J 2463/02; C08L 2205/03; C08L 2201/02; C08L 65/00; C08L 79/08; C08L 79/085; C08L 2203/20; C08L 2205/035; C08L 2203/16; B32B 15/20; B32B 2260/045; B32B 15/04; B32B 2457/08; B32B 2260/043
  See application file for complete search history.

(56) References Cited

U.S. PATENT DOCUMENTS

| | | | | |
|---|---|---|---|---|
| 4,393,188 A * | 7/1983 | Takahashi | .......... | C08G 59/4042 428/413 |
| 4,435,560 A | 3/1984 | Takahashi et al. | | |
| 2009/0298970 A1 | 12/2009 | Attarwala et al. | | |
| 2015/0050472 A1 * | 2/2015 | Saito | .......... | C08K 3/22 428/206 |
| 2015/0210906 A1 | 7/2015 | Liang et al. | | |
| 2016/0185904 A1 * | 6/2016 | Gao | .......... | C08L 71/126 524/508 |
| 2017/0145213 A1 * | 5/2017 | Nomizu | .................. | B32B 15/08 |
| 2018/0208765 A1 * | 7/2018 | Liu | .......... | C08L 71/126 |
| 2018/0362733 A1 † | 12/2018 | Yao | | |

FOREIGN PATENT DOCUMENTS

| | | | |
|---|---|---|---|
| EP | 0508579 A | * | 10/1992 |
| EP | 3321289 A1 | | 5/2018 |
| JP | 6445426 A | * | 2/1989 |
| JP | 01236227 A | * | 9/1989 |
| JP | 01266124 A | * | 10/1989 |
| JP | 2000158589 A | * | 6/2000 |
| TW | 201422710 A | | 6/2014 |
| TW | 201636205 A | | 10/2016 |
| TW | 201710346 A | | 3/2017 |
| WO | WO-2016010033 A1 * | 1/2016 | ............. B32B 15/08 |

OTHER PUBLICATIONS

Yonekura et al., JP2000158589A machine translation. Jun. 2000 (Year: 2000).*

(Continued)

*Primary Examiner* — John D Freeman
(74) *Attorney, Agent, or Firm* — Michael W. Ferrell; Ferrells, PLLC; Anna Kinney

(57) ABSTRACT

A resin composition is provided. The resin composition comprises the following components:
(A) epoxy resin;
(B) a cross-linking agent;
(C) bismaleimide resin (BMI) represented by the following formula (I):

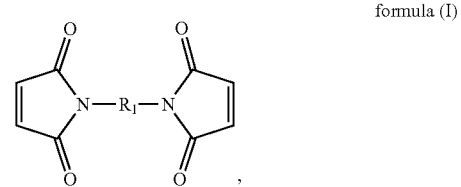

formula (I)

wherein $R_1$ is an organic group; and
(D) a resin represented by the following formula (II):

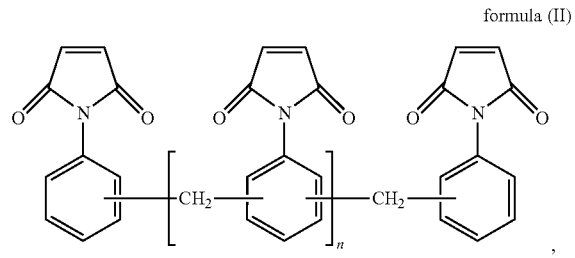

formula (II)

wherein n is an integer of 1 to 10.

11 Claims, No Drawings

(56) References Cited

OTHER PUBLICATIONS

Machine translaton of JP 01-266124. (Year: 1989).*
Machine translaton of JP 01-236227. (Year: 1989).*
Taiwanese Office Action dated May 23, 2018.

\* cited by examiner
† cited by third party

RESIN COMPOSITION, AND PRE-PREG, METAL-CLAD LAMINATE AND PRINTED CIRCUIT BOARD PREPARED USING THE SAME

CLAIM FOR PRIORITY

This application claims the benefit of Taiwan Patent Application No. 106130635 filed on Sep. 7, 2017, the subject matters of which are incorporated herein in their entirety by reference.

BACKGROUND OF THE INVENTION

Field of the Invention

The present invention provides a resin composition, especially an epoxy resin-based resin composition useful in providing an electronic material with outstanding thermal resistance. The resin composition of the present invention can be used in combination with glass fibers to constitute a composite material or prepreg, and furthermore can be used as a metal foil adhesive to manufacture a laminate and printed circuit board.

Descriptions of the Related Art

Recently, the developments of printed circuit boards have primarily focused on the lead-free process and high density interconnect (HDI) circuit design. The biggest challenge facing materials of dielectric resin layers is adapting the thermal resistance and warpage of dielectric resin layers of metal-clad laminate materials used for preparing printed circuit boards to higher processing temperatures and HDI circuit designs. Dielectric resin layers are generally made of epoxy resin-based dielectric materials. However, epoxy resin-based dielectric materials usually have poor thermal resistance and warpage issue.

Bismaleimide (BMI) resin is one of the known substitutes of epoxy resins. It can replace epoxy resins or be added into epoxy resin-based dielectric materials to provide better thermal resistance. Bismaleimide resin has two functional groups, i.e., two reactive carbon-carbon double bonds, such that the molecules of bismaleimide resin can undergo cross-linking reaction through heat or in the presence of a catalyst. Bismaleimide resin can impart outstanding thermal resistance to the dielectric material prepared thereby. However, the dielectric materials containing bismaleimide resin still have several disadvantages. For example, the dielectric materials containing bismaleimide resin have poor adhesion property to metal foils (e.g., copper foils), i.e., poor peeling strength, and unsatisfactory electrical properties (e.g., dissipation factor (Df)). These reasons make the application of bismaleimide resin in the epoxy resin-based dielectric material quite limited.

There is still a need for a printed circuit board which has outstanding thermal resistance, outstanding electrical properties (low dielectric constant (Dk) and low Df), outstanding peeling strength and low warpage.

SUMMARY OF THE INVENTION

In view of the aforementioned technical problems, the present invention provides a resin composition in manufacturing electronic materials with high thermal resistance, good electrical properties (low Df and Dk), high peeling strength, good alkali resistance and metal-clad laminates with low warpage.

As illustrated in the following objectives, one of the technical means of the present invention is to use an epoxy resin, a resin with a specific structure, and a bismaleimide resin with a specific structure to provide electronic materials with the aforementioned advantages.

An objective of the present invention is to provide a resin composition, which comprises the following constituents:

(A) an epoxy resin;

(B) a cross-linking agent;

(C) a bismaleimide resin (BMI) represented by the following formula (I):

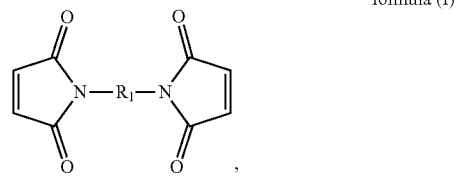

formula (I)

wherein $R_1$ is an organic group; and (D) a resin represented by the following formula (II):

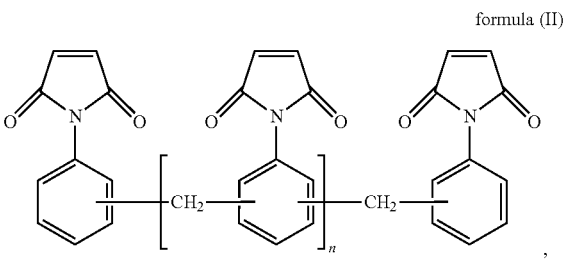

formula (II)

wherein n is an integer of 1 to 10.

In some embodiments of the present invention, $R_1$ of formula (I) is selected from the group consisting of methylene (—$CH_2$—), 4,4'-diphenylmethane group

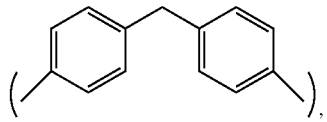

m-phenylene

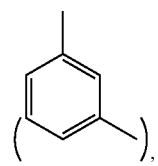

bisphenol A diphenyl ether group

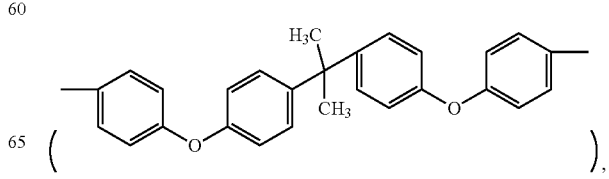

3,3'-dimethyl-5,5'-diethyl-4,4'-diphenylmethane group

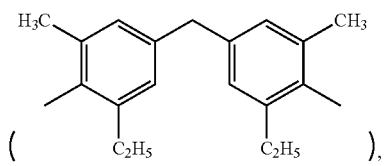

4-methyl-1,3-phenylene

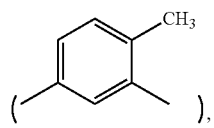

or (2,2,4-trimethyl) hexamethylene

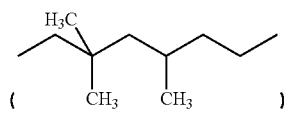

In some embodiments of the present invention, the epoxy resin is selected from the group consisting of novolac epoxy resins, dicyclopentadiene (DCPD) epoxy resins, bisphenol epoxy resins, diphenylethylene epoxy resins, triazine skeleton-containing epoxy resins, fluorene skeleton-containing epoxy resins, triphenol methane epoxy resins, biphenyl epoxy resins, xylylene epoxy resins, biphenyl aralkyl epoxy resins, naphthalene epoxy resins, alicyclic epoxy resins, and combinations thereof.

In some embodiments of the present invention, the cross-linking agent is selected from the group consisting of styrene maleic anhydride (SMA) resins, cyanate ester resins, benzoxazine resins, phenolic novolac (PN) resins, dicyandiamide (Dicy), diaminodiphenyl sulfone (DDS), amino triazine novolac (ATN) resins, diaminodiphenylmethane, styrene-vinyl phenol copolymers, and combinations thereof.

In some embodiments of the present invention, the weight ratio of the bismaleimide resin represented by formula (I) to the resin represented by formula (II) is about 3:1 to about 1:3, preferably about 1:2 to about 2:1.

In some embodiments of the present invention, based on the dry weight of the resin composition, the amount of the epoxy resin is about 1 wt % to about 20 wt %, the amount of the bismaleimide resin represented by formula (I) is about 5 wt % to about 35 wt %, and the amount of the resin represented by formula (II) is about 5 wt % to about 35 wt %.

In some embodiments of the present invention, the resin composition further comprises a core/shell rubber.

In some embodiments of the present invention, the resin composition further comprises a filler selected from the group consisting of silica (e.g., hollow silica), aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzs, diamonds, diamond-like carbon, graphites, calcined kaolin, pryan, micas, hydrotalcite, polytetrafluroroethylene (PTFE) powders, glass beads, ceramic whiskers, carbon nanotubes, nanosized inorganic powders, and combinations thereof.

In some embodiments of the present invention, the resin composition further comprises an additive selected from the group consisting of tougheners, flame retardants, catalysts, dispersing agents, and combinations thereof.

Another objective of the present invention is to provide a prepreg, which is prepared by impregnating a substrate with the aforementioned resin composition or by coating the aforementioned resin composition onto a substrate and drying the impregnated or coated substrate.

Yet another objective of the present invention is to provide a metal-clad laminate, which is prepared by laminating the aforementioned prepreg with a metal foil or prepared by coating the aforementioned resin composition onto a metal foil and drying the coated metal foil.

Yet another objective of the present invention is to provide a printed circuit board, which is prepared from the aforementioned metal-clad laminate.

To render the above objectives, the technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification. Furthermore, for clarity, the size of each element and each area may be exaggerated in the appended drawings and not depicted in actual proportion. Unless it is additionally explained, the expressions "a," "the," or the like recited in the specification (especially in the claims) should include both the singular and the plural forms. Furthermore, unless it is additionally explained, while describing the constituents in the solution, mixture and composition in the specification, the amount of each constituent is calculated based on the dry weight, i.e., regardless of the weight of the solvent.

The present invention provides a resin composition which uses an epoxy resin together with a bismaleimide resin and a resin with a specific structure. The resin composition is capable of improving the thermal resistance and alkali resistance of the electronic material manufactured thereby without sacrificing the electrical properties and peeling strength of the electronic material. Furthermore, the resin composition could avoid or at least lower the warpage of the metal-clad laminate manufactured thereby.

Resin Composition

The resin composition of the present invention comprises an epoxy resin, a cross-linking agent, a bismaleimide resin, and a resin with a specific structure. The detailed descriptions for each constituent of the resin composition are provided below.

(A) Epoxy Resin

As used herein, an epoxy resin refers to a thermosetting resin with at least two epoxy functional groups in a molecule, such as a multi-functional epoxy resin, a linear phenolic epoxy resin, or a combination thereof. The multi-functional epoxy resin may be a bifunctional epoxy resin, a tetrafunctional epoxy resin, an octofunctional epoxy resin, and the like. Examples of the epoxy resin include but are not limited to phenolic epoxy resins, bisphenol epoxy resins, dicyclopentadiene (DCPD) epoxy resins, diphenylethylene epoxy resins, triazine skeleton-containing epoxy resins, fluorene skeleton-containing epoxy resins, triphenol methane epoxy resins, biphenyl epoxy resins, xylylene epoxy resins, biphenyl aralkyl epoxy resins, naphthalene epoxy resins, alicyclic epoxy resins, and combinations thereof. Examples of phenolic epoxy resins include but are not limited to phenol phenolic epoxy resins, cresol phenolic epoxy resins, bisphenol A phenolic epoxy resins, and bisphenol F phenolic epoxy resins. Examples of bisphenol epoxy resins include but are not limited to bisphenol A epoxy resins, bisphenol F epoxy resins, and bisphenol S epoxy resins. Examples of the epoxy resin also include diglycidyl ether compounds of multi-ring aromatics such as multi-functional phenols and anthracenes. Furthermore, phosphorous may be introduced into the epoxy resin to provide a phosphorous-containing epoxy resin. If the epoxy resin does not need to be halogen-free, a bromine-containing epoxy resin, such as tetrabromobisphenol A epoxy resin, can also be used.

The aforementioned epoxy resins can be used either alone or in combination depending on the need of persons with ordinary skill in the art. In the appended examples, bisphenol A phenolic epoxy resins are used.

In the resin composition of the present invention, based on the dry weight of the resin composition, the amount of the epoxy resin is preferably about 1 wt % to about 20 wt %, and more preferably about 5 wt % to about 15 wt %, such as 5.5 wt %, 6 wt %, 7 wt %, 7.5 wt %, 8 wt %, 8.5 wt %, 8.7 wt %, 9 wt %, 10 wt %, 11 wt %, 12 wt %, 13 wt %, or 14 wt %. The aforementioned designated preferred ranges allow the epoxy resin to give full play to its advantages, which include, for example, giving the manufactured electronic material good electrical properties and high glass transition temperature (Tg), without affecting the characteristics of other constituents of the resin composition.

(B) Cross-Linking Agent

As used herein, a cross-linking agent refers to a compound containing reactive functional groups, which can participate in curing reactions and form a network structure, thereby improving the characteristics of the prepared electronic material, such as the glass transition temperature (Tg), water absorption, and Df of the electronic material.

Examples of the aforementioned compound containing reactive functional groups include but are not limited to compounds containing —OH group(s), compounds containing amino group(s), anhydride compounds, and active ester compounds. Examples of the compounds containing amino group(s) include but are not limited to aromatic diamines. Examples of anhydride compounds include but are not limited to aromatic dianhydrides or aliphatic dianhydrides. For example, the resin composition of the present invention may comprise one or more cross-linking agents selected from the group consisting of SMA resins, cyanate ester resins, benzoxazine resins, PN resins, Dicy, DDS, ATN resins, diaminodiphenylmethane, and styrene-vinyl phenol copolymers. In the appended Examples, SMA resins are illustrated as the cross-linking agent.

In general, based on the dry weight of the resin composition, the amount of the cross-linking agent is usually about 1 wt % to about 30 wt %, and preferably about 5 wt % to about 25 wt %, such as 5.5 wt %, 6 wt %, 7 wt %, 7.5 wt %, 8 wt %, 8.5 wt %, 8.7 wt %, 9 wt %, 10 wt %, 12 wt %, 13 wt %, 15 wt %, 16 wt %, 18 wt %, 20 wt %, 21 wt %, 22 wt %, or 24 wt %. The amount of the cross-linking agent is not limited to the aforementioned ranges but can be adjusted depending on the need of persons with ordinary skill in the art.

(C) Bismaleimide Resin (BMI) Represented by Formula (I)

The resin composition of the present invention comprises a bismaleimide resin with a specific structure, which is a compound with two maleimide functional groups. Maleimide functional groups have reactive carbon-carbon double bonds that can perform cross-linking reactions with other unsaturated functional groups in the resin composition, and they can improve the thermal resistance of the cured material of the resin composition. The bismaleimide resin in the resin composition of the present invention is represented by the following formula (I):

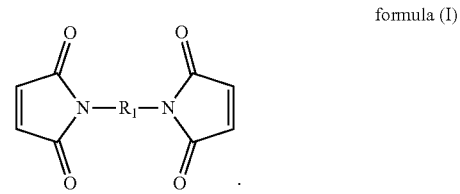

formula (I)

In formula (I), $R_1$ is an organic group, and is preferably selected from the group consisting of methylene (—$CH_2$—), 4,4'-diphenylmethane group

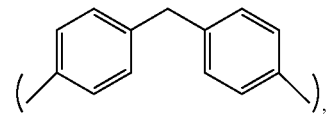

m-phenylene

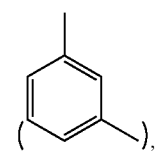

bisphenol A diphenyl ether group

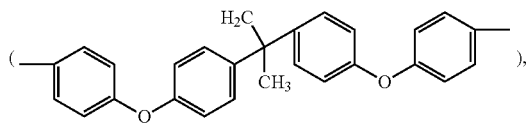

3,3'-dimethyl-5,5'-diethyl-4,4'-diphenylmethane group

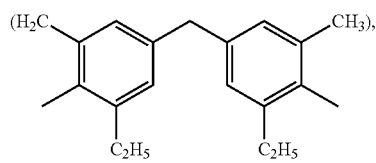

4-methyl-1,3-phenylene

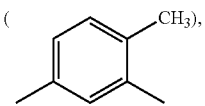

and (2,2,4-trimethyl) hexamethylene

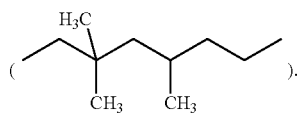

Specific examples of the bismaleimide resin represented by formula (I) include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenylether, 3,3'-bismaleimidodiphenylsulfone, 4,4'-bismaleimidodiphenylsulfone, 4,4'-bismaleimidodicyclohexylmethane, 3,5-bis(4-maleimidophenyl)pyridine, 2,6-bismaleimidopyridine, 1,3-bis(maleimidomethyl)cyclohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyletherbismaleimide, N,N'-4,4'-diphenylsufonebismaleimide, N,N'-4,4'-dicyclohexylmethanebismaleimide, N,N'-α,α'-4,4'-dimethylenecyclohexane bismaleimide, N,N'-m-xylenebismaleimide, N,N'-4,4'-diphenylcyclohexanebismaleimide, and N,N'-methylenebis(3-chloro-p-phenylene) bismaleimide. Commercially available bismaleimide resins represented by formula (I) include the products with trade names BMI-70 and BMI-80 available from KI Chemical Company and the products with trade names BMI-1000, BMI-4000, BMI-5000, BMI-5100, and BMI-7000 available from DAIWAKASEI Industry (Wakayama, Japan). The aforementioned bismaleimide resins can be used either alone or in combination depending on the need of persons with ordinary skill in the art. In the appended examples, a bismaleimide resin represented by formula (I), in which $R_1$ is 3,3'-dimethyl-5,5'-diethyl-4,4'-diphenylmethane group

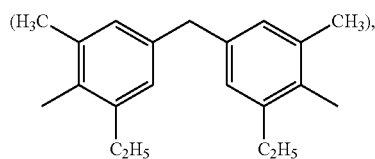

is used.

In the resin composition of the present invention, based on the dry weight of the resin composition, the amount of the bismaleimide resin represented by formula (I) is preferably about 5 wt % to about 35 wt %, and more preferably about 10 wt % to about 30 wt %, such as 11 wt %, 12 wt %, 13 wt %, 15 wt %, 15.5 wt %, 15.7 wt %, 16 wt %, 17 wt %, 17.5 wt %, 18 wt %, 18.5 wt %, 19 wt %, 20 wt %, 21 wt %, 23 wt %, 24 wt %, 25 wt %, 26 wt %, 28 wt %, or 29 wt %. The aforementioned designated preferred ranges allow the bismaleimide resin represented by formula (I) to give full play to its advantages, which include, for example, giving the manufactured electronic material better thermal resistance and lower warpage, without affecting the characteristics of other constituents of the resin composition. When the amount of the bismaleimide resin represented by formula (I) is lower than the designated ranges (e.g., lower than 5 wt %), the bismaleimide resin represented by formula (I) may not give full play to its advantages. When the amount of the bismaleimide resin represented by formula (I) is higher than the designated ranges (e.g., higher than 30 wt %), some properties of the manufactured electronic material, such as the peeling strength and dimensional stability, may deteriorate, and the Df value of the electronic material may increase.

(D) Resin Represented by Formula (II)

The resin composition of the present invention comprises a resin represented by the following formula (II):

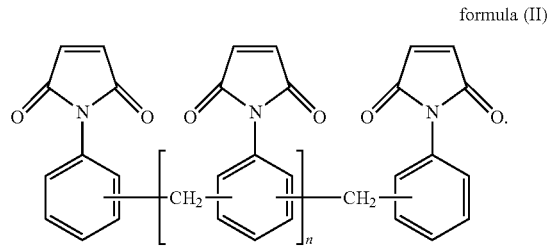

formula (II)

In formula (II), n is an integer of 1 to 10. The resin represented by formula (II) is an oligomer that has at least three maleimide groups and is usually obtained from aniline, formaldehyde condensate and maleic anhydride. Detailed descriptions of the resin represented by formula (II) can be found in, for example, U.S. Pat. No. 4,435,560, and the subject matters of which are incorporated herein in their entirety by reference. Commercially available resins represented by formula (II) include products with trade names BMI-2000 and BMI-2300 (CAS No. 67784-74-1) available from DAIWAKASEI Industry.

In the resin composition of the present invention, based on the dry weight of the resin composition, the amount of the resin represented by formula (II) is preferably about 5 wt % to about 35 wt %, and more preferably about 10 wt % to about 30 wt %, such as 11 wt %, 12 wt %, 13 wt %, 15 wt %, 15.5 wt %, 15.7 wt %, 16 wt %, 17 wt %, 17.5 wt %, 18 wt %, 18.5 wt %, 19 wt %, 20 wt %, 21 wt %, 23 wt %, 24 wt %, 25 wt %, 26 wt %, 28 wt %, or 29 wt %. The aforementioned designated preferred ranges allow the resin represented by formula (II) to give full play to its advantages, which include, for example, making the reactivity of the resin composition better and giving the electronic material manufactured thereby better peeling strength and dimensional stability as well as lower Df, without affecting the characteristics of other constituents of the resin composition. When the amount of the resin represented by formula (II) is lower than the designated ranges (e.g., lower than 5 wt %), the resin represented by formula (II) may not give full play to its advantages. When the amount of the resin represented by formula (II) is higher than the designated ranges (e.g., higher than 30 wt %), some properties of the manufactured electronic material, such as the alkali resistance of the electronic material, may deteriorate, and the Df and warpage of the electronic material may increase.

It has been found that using the bismaleimide resin represented by formula (I) together with the resin represented by formula (II) in an epoxy resin composition system not only retains the advantages of bismaleimide resin, but also eliminates the disadvantages of bismaleimide resin. Thus, the electronic material manufactured thereby has not only good thermal resistance but also excellent peeling strength and electrical properties (e.g., low Df). To obtain the synergistic effect of the bismaleimide resin represented by formula (I) and the resin represented by formula (II), in the resin composition of the present invention, the weight ratio of the bismaleimide resin represented by formula (I) to the resin represented by formula (II) is preferably about 3:1 to about 1:3, more preferably about 2:1 to 1:2, and most preferably about 1:1. When the weight ratio of the bismaleimide resin represented by formula (I) to the resin represented by formula (II) is 1:1, the manufactured electronic material is provided with good physicochemical properties and electrical properties, and especially, high peeling strength and low warpage.

(E) Other Optional Constituents

In the resin composition of the present invention, other constituents may be optionally comprised. For example, the core/shell rubber as described below, fillers and additives well-known to persons with ordinary skill in the art can be added into the resin system (a) to improve the physicochemical properties of the electronic material manufactured by using the resin composition or the processability of the resin composition during the manufacturing process.

[Core/Shell Rubber]

Using bismaleimide resin in an epoxy resin composition may embrittle the prepared electronic material. Therefore, the resin composition of the present invention may further comprise a core/shell rubber as a toughener, which improves the brittleness of the prepared electronic material and strengthens the electronic material.

As used herein, the core/shell rubber refers to a rubber with a double-layer structure. The double-layer structure includes a core layer (inner layer) and a shell layer (outer layer) enveloping the core layer. The core layer is usually composed of diene elastomers or siloxanes, and the main function of the core layer lies in stress absorbing. The shell layer is usually composed of a polymer material that has high compatibility with other constituents of the resin composition. Examples of such polymer material includes polymers or copolymers formed by one or more monomers selected from acrylic acid monomers, methacrylic acid monomers, styrene monomers, and acrylonitrile monomers. The main function of the shell layer is to envelope the outside of the core layer, thereby facilitating the compatibility between the core/shell rubber and the resin composition, and making the core/shell rubber well dispersed in the resin composition.

The core/shell rubber may be prepared by any conventional method. For example, the core/shell rubber may be prepared by the method disclosed in US Patent Laid-open Publication No. 2009/0298970, the subject matters of which are incorporated herein in their entirety by reference. Examples of commercially available core/shell rubber include the products with trade names MX-120, MX-125, MX-130, MX-156 and MX-551 available from KANEKA Company, KANE ACE series products also available from KANEKA Company, and the product with trade name METABLEN SX-006 available from MITSUBISHI RAYON Company.

In general, based on the dry weight of the resin composition, the amount of the core/shell rubber is usually about 1 wt % to about 20 wt %, such as 2 wt %, 4 wt %, 4.5 wt %, 6 wt %, 7 wt %, 8 wt %, 8.5 wt %, 9 wt %, 10 wt %, 12 wt %, 13 wt %, 14 wt %, 16 wt %, 17 wt %, 18 wt %, or 19 wt %. To provide desired toughening effects without affecting the inherent characteristic of the resin composition, the amount of the core/shell rubber is preferably about 1 wt % to about 15 wt %, and more preferably about 1 wt % to about 5 wt %. When the amount of the core/shell rubber is lower than the designated ranges (e.g., lower than 1 wt %), the desired toughening effects may not be obtained. When the amount of the core/shell rubber is higher than the designated ranges (e.g., higher than 20 wt %), the resin composition may become heterogeneous, and the thermal resistance, flame retardance, and dimensional stability of the prepared electronic material may deteriorate.

[Filler]

The resin composition of the present invention may further comprise a filler. Examples of the filler include but are not limited to an organic filler or inorganic filler selected from the group consisting of silica (e.g., hollow silica), aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzs, diamonds, diamond-like carbon, graphites, calcined kaolin, pryan, micas, hydrotalcite, polytetrafluroroethylene (PTFE) powders, glass beads, ceramic whiskers, carbon nanotubes, nanosized inorganic powders, and combinations thereof.

In general, based on the dry weight of the resin composition, the amount of the filler is usually greater than 0 wt % to about 40 wt %, such as about 1 wt %, about 3 wt %, about 5 wt %, about 7 wt %, about 10 wt %, about 15 wt %, about 20 wt %, about 25 wt %, about 30 wt %, or about 35 wt %. The amount of the filler is not limited to the aforementioned range but can be adjusted depending on the need of persons with ordinary skill in the art.

[Flame Retardant]

The resin composition of the present invention may further comprise a flame retardant, such as a halogen-containing flame retardant or a halogen-free flame retardant, to improve the flame retardance of the electronic material manufactured thereby.

Halogen-containing flame retardants refer to flame retardants containing halogen atoms, wherein the halogen atoms may be bromine atoms. Examples of halogen-containing flame retardants include but are not limited to decabromo diphenyl ethane (e.g., the product with trade name Saytex 8010 available from Albemarle Company), ethyl-bis(tetrabromo phthalimide) (e.g., the product with trade name BT-93 available from Albemarle Company), dibromobiphenyl (e.g., the product available from Sigma-Aldrich Company), and tris(tribromophenoxy) triazine (e.g., the product with trade name FR-245 available from ICL Company).

Examples of halogen-free flame retardants include but are not limited to nitrogen-containing compounds, phosphor-containing compounds, and metal phosphinates. Examples of nitrogen-containing compounds include but are not limited to melamines and derivatives thereof (e.g., a product with trade name Melapur 200 available from BASF Company). Examples of phosphor-containing compounds include but are not limited to 9,10-dihydro-9-oxa-10-phosphahenanthrene-10-oxide (DOPO) and derivatives thereof (e.g., the product with trade name XZ-92741 available from DOW Company, and the product with trade name XP-7866 available from Albemarle Company), phenoxy cyclophosphazene (e.g., the product with trade name SPB-100 available from Otsuka Chemical Company), and resorcinol bis[di(2,6-dimethyl phenyl) phosphate] (e.g., the product with trade name PX-200 available from Otsuka Chemical Company). Examples of metal phosphinates include but are not limited to aluminum phosphinate (e.g., the product with trade name OP-935 available from Clariant Company).

The aforementioned flame retardants can be used either alone or in combination. In general, based on the dry weight of the resin composition, the amount of the flame retardant is usually about 2 wt % to about 40 wt %, and preferably about 5 wt % to about 15 wt %. When the amount of the flame retardant is less than the designated ranges (e.g., lower than 2 wt %), the flame retardance of the manufactured electronic material may be insufficient. When the amount of the flame retardant is higher than the designated ranges (e.g., higher than 40 wt %), the characteristics of the manufactured electronic material may be adversely affected; for example, the electrical properties and peeling strength of electronic material may deteriorate and the water absorption of the electronic material may increase.

[Catalyst]

The resin composition of the present invention may further comprise a catalyst to facilitate the reaction of epoxy functional groups and lower the required curing reaction temperature of the resin composition. The type of the catalyst is not particularly limited as long as the catalyst can promote the ring-opening of the epoxy functional groups and lower the curing reaction temperature of the resin composition. Examples of the catalyst include but are not limited to organic compounds such as tertiary amines, quaternary ammoniums, imidazoles, pyridines, and the like, and transition metals and oxides thereof. The aforementioned catalysts can be used either alone or in combination. Specifically, the catalyst may be selected from the group consisting of 2-methyl imidazole, 2-ethyl-4-methyl imidazole, 2-phenyl imidazole, benzyldimethylamine, 2-(dimethylamino methyl) phenol, 2,4,6-tri(dimethylamino methyl) phenol, 2,3-diamino pyridine, 2,5-diamino pyridine, 2,6-diamino pyridine, 4-dimethylamino pyridine, 2-amino-3-methyl pyridine, 2-amino-4-methyl pyridine, 2-amino-3-nitro pyridine, zinc oxide, and combinations thereof.

In general, based on the dry weight of the resin composition, the amount of the catalyst is usually about 0.5 wt % to about 5 wt %, but the present invention is not limited thereto. The amount of the catalyst can be adjusted depending on the need of persons with ordinary skill in the art.

Preparation of Resin Composition

The resin composition of the present invention may be prepared into varnish form for subsequent applications by evenly mixing the resin composition (including the epoxy resin, the cross-linking agent, the bismaleimide resin represented by formula (I), the resin represented by formula (II), and other optional constituents) through a stirrer and dissolving or dispersing the obtained mixture into a solvent. The solvent here can be any inert solvent that can dissolve or disperse the constituents of the resin composition of the present invention, but does not react with the constituents. Examples of the solvent which can dissolve or disperse the constituents of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methyl-pyrolidone (NMP). The listed solvents can be used either alone or in combination. The amount of the solvent is not particularly limited as long as the constituents of the resin composition can be evenly dissolved or dispersed therein. In the appended Examples, a mixture of toluene, methyl ethyl ketone and γ-butyrolactone is used as the solvent.

Prepreg

The present invention also provides a prepreg prepared from the abovementioned resin composition, wherein the prepreg is obtained by impregnating a substrate into the abovementioned resin composition or coating the aforementioned resin composition onto a substrate, and drying the impregnated or coated substrate. Examples of the substrate include glass fiber reinforcing materials (e.g., glass-fiber woven fabrics or non-woven fabrics, glass papers, and glass mats), kraft papers, short fiber cotton papers, nature fiber cloths, organic fiber cloths, liquid crystal polymer fiber mats, and the like. In some embodiments of the present invention, 2116 glass fiber cloth are used as the reinforcing material (i.e., substrate), and the reinforcing material is heated and dried at 175° C. for 2 to 15 minutes (B-stage) to provide a semi-cured prepreg.

Metal-Clad Laminate and Printed Circuit Board

The present invention also provides a metal-clad laminate prepared from the abovementioned prepreg. The metal-clad laminate comprises a dielectric layer and a metal layer, wherein the dielectric layer is provided by the abovementioned prepreg. The metal-clad laminate may be prepared either by laminating the aforementioned prepreg with a metal foil or by coating the aforementioned resin composition onto a metal foil and drying the coated metal foil. In the case that the metal-clad laminate is prepared by using the prepreg, the metal-clad laminate may be prepared by the following process: (1) superimposing a plurality of the aforementioned prepregs and then superimposing a metal foil (such as a copper foil) on at least one external surface of an dielectric layer composed of the superimposed prepregs to provide a superimposed object; and (2) performing a hot-pressing operation onto the superimposed object to obtain the metal-clad laminate.

Further, a printed circuit board may be prepared by patterning the external metal foil of the aforementioned metal-clad laminate.

The present invention will be further illustrated by the embodiments hereinafter, wherein the measuring instruments and methods are respectively as follows:

[Water Absorption Test]

The moisture resistance of the metal-clad laminate is tested by a pressure cooker test (PCT), i.e., subjecting the metal-clad laminate into a pressure container (121° C., saturated relative humidity (100% R.H.) and 1.2 atm) for 2 hours.

[Solder Resistance Test]

The solder resistance test is carried out by immersing the dried metal-clad laminate in a solder bath at 288° C. for a certain period and observing whether there is any defect such as delamination and blistering.

[Peeling Strength Test]

The peeling strength refers to the bonding strength between the metal foil and laminated prepreg, which is expressed by the force required for vertically peeling the clad copper foil with a width of ⅛ inch from the surface of the laminated prepreg in the peeling strength test.

[Glass Transition Temperature (Tg) Test]

The glass transition temperature (Tg) is measured by using a Differential Scanning Calorimeter (DSC), wherein the measuring methods are IPC-TM-650.2.4.25C and 24C testing method of the Institute for Interconnecting and Packaging Electronic Circuits (IPC).

[Thermal Expansion Percentage Test]

The thermal expansion percentage of the sample (a metal-clad laminate in a size of 3 mm$^2$) in thickness direction (i.e., z-axis direction) is tested by the thermal expansion analyzer of TA instrument company (model No.: TA 2940) between a temperature gap ranging from 50° C. to 260° C. (heating rate: 10° C./min).

[Flame Retardance Test]

The flame retardance test is carried out according to UL94V (Vertical Burn), which comprises the burning of a laminate, which is held vertically, using a Bunsen burner to compare its self-extinguishing properties and combustion-supporting properties. The ranking for the flame retardance levels is V0>V1>V2.

[Dielectric Constant (Dk) and Dissipation Factor (Df) Measurement]

Dk and Df of the metal-clad laminate are measured according to ASTM D150 under an operating frequency of 10 GHz.

[Alkali Resistance Test]

The alkali resistance test is carried out by immersing a laminate without a copper foil (i.e., a laminate formed by laminating and hot-pressing only the prepregs of the present invention) in NaOH solution with a concentration of 20 wt % at 90° C. for 10 minutes, and observing whether the appearance of the immersed laminate is etched or not. If the appearance of the immersed laminate is not etched, the alkali resistance test is recorded as "PASS". If the appearance of the immersed laminate is etched, the alkali resistance test is recorded as "FAIL".

[Laminate Warpage Test]

The warpage of the metal-clad laminate is calculated by etching one side of the metal-clad laminate according to IPC TM-650-2.4.22 standards and observing and calculating the bending of the metal-clad laminate.

[Test of Wear Percentage on the Drill]

The wear percentage on the drill is tested by drilling the metal-clad laminate using a drill with a diameter of 0.3 mm and repeating 2000 times, and then observing the wear of the drill top surface. Since the cutting edge (CE) of the drill is maintained in contact with the metal-clad laminate and continuously worn, the cutting corner (CC) of the cutting edge CE will be worn. In this test, the wear percentage on the drill means the wear percentage of the cutting corner CC.

EXAMPLES

[Preparation of Resin Composition]

Example 1

According to the ratio shown in Table 1, an epoxy resin (trade name: BNE 210, available from Chang Chun Plastics Co., Ltd.), SMA resin (trade name: EF-40, available from CRAY VALLEY) as a cross-linking agent, a bismaleimide resin represented by formula (I) ($R_1$ is

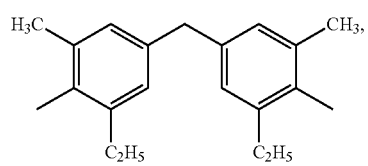

trade name: BMI-70, available from KI Chemical Company), a resin represented by formula (II) (trade name: BMI-2300, available from DAIWAKASEI Industry), a filler (trade name: 525ARI, available from Sibelco), a flame retardant (trade name: SPB-100, available from Otsuka Chemical Company), 2-ethyl-4-methyl imidazole (trade name: 2E4MZ, available from UNION CHEMICAL IND. CO., LTD) and zinc oxide (trade name: 3328, available from The Shepherd Chemical Company) as catalysts were mixed under room temperature with a stirrer followed by adding toluene, methyl ethyl ketone and γ-butyrolactone (all available from Fluka Company) thereinto. After stirring the resultant mixture under room temperature for 60 to 120 minutes, resin composition 1 was obtained.

Example 2

The preparation procedures of resin composition 1 were repeated to prepare resin composition 2, except that the amounts of the bismaleimide resin represented by formula (I) and the resin represented by formula (II) were adjusted as shown in Table 1.

Example 3

The preparation procedures of resin composition 1 were repeated to prepare resin composition 3, except that the amounts of the bismaleimide resin represented by formula (I) and the resin represented by formula (II) were adjusted as shown in Table 1.

Example 4

The preparation procedures of resin composition 3 were repeated to prepare resin composition 4, except that a core/shell rubber (trade name: TMS-2670, available from DOW Chemical) as a toughener was further added, and the amount of the filler was adjusted as shown in Table 1.

Example 5

The preparation procedures of resin composition 4 were repeated to prepare resin composition 5, except that the amounts of the filler and the core/shell rubber were adjusted as shown in Table 1.

Example 6

The preparation procedures of resin composition 4 were repeated to prepare resin composition 6, except that the amounts of the filler and the core/shell rubber were adjusted as shown in Table 1.

Comparative Example 1

The preparation procedures of resin composition 1 were repeated to prepare comparative resin composition 1, except that the bismaleimide resin represented by formula (I) was not added, and the amount of the resin represented by formula (II) was adjusted as shown in Table 1.

Comparative Example 2

The preparation procedures of resin composition 1 were repeated to prepare comparative resin composition 2, except that the resin represented by formula (II) was not added, and the amount of the bismaleimide resin represented by formula (I) was adjusted as shown in Table 1.

TABLE 1

Composition of resin compositions

| Unit: parts by weight | | Resin composition 1 | 2 | 3 | 4 | 5 | 6 | Comparative resin composition 1 | 2 |
|---|---|---|---|---|---|---|---|---|---|
| Epoxy resin | BNE 210 | 10 | 10 | 10 | 10 | 10 | 10 | 10 | 10 |
| Bismaleimide resin of formula (I) | BMI 70 | 10 | 30 | 20 | 20 | 20 | 20 | | 40 |
| Resin of formula (II) | BMI 2300 | 30 | 10 | 20 | 20 | 20 | 20 | 40 | |
| Cross-linking agent | EF-40 | 10 | 10 | 10 | 10 | 10 | 10 | 10 | 10 |
| Filler | 525ARI | 30 | 30 | 30 | 33 | 35 | 37 | 30 | 30 |
| Core/shell rubber | TMS-2670 | | | | 5 | 10 | 20 | | |
| Flame retardant | SPB-100 | 10 | 10 | 10 | 10 | 10 | 10 | 10 | 10 |
| Catalyst | 2E4MZ | 0.05 | 0.05 | 0.05 | 0.05 | 0.05 | 0.05 | 0.05 | 0.05 |
| | 3328 | 0.1 | 0.1 | 0.1 | 0.1 | 0.1 | 0.1 | 0.1 | 0.1 |

[Preparation of Metal-Clad Laminate]

Metal-clad laminates 1 to 6 and comparative metal-clad laminates 1 and 2 were prepared by using resin compositions 1 to 6 and comparative resin compositions 1 and 2, respectively. First, glass fiber cloths (trade name: 2116, thickness: 0.08 mm) were respectively impregnated into resin compositions 1 to 6 and comparative resin compositions 1 and 2 by means of a roller coating machine. The thickness of the glass fiber cloths was controlled to an appropriate extent. Next, the impregnated glass fiber cloths were placed in an oven and heated and dried at 175° C. for 2 to 15 minutes to produce prepregs in a semi-cured state (B-stage) (resin content of the prepregs: about 53%). Afterwards, four pieces of the prepregs were superimposed and two sheets of copper foil (0.5 oz.) were respectively superimposed on both of the two outer surfaces of the superimposed prepregs to provide a superimposed object. A hot-pressing operation was performed on each of the prepared objects to provide metal-clad laminates 1 to 6 (corresponding to resin compositions 1 to 6, respectively) and comparative metal-clad laminates 1 and 2 (corresponding to comparative resin compositions 1 and 2, respectively). Herein, the hot-pressing conditions are as follows: raising the temperature to about 200° C. to 220° C. with a heating rate of 3.0° C./min, and hot-pressing for 180 minutes under a full pressure of 15 kg/cm² (initial pressure is 8 kg/cm²) at said temperature.

The water absorption, solder resistance, peeling strength, glass transition temperature (Tg), thermal expansion percentage, flame retardance, dissipation factor (Df), dielectric constant (Dk), alkali resistance, warpage, and wear percentage on the drill of metal-clad laminates 1 to 6 and comparative metal-clad laminates 1 and 2 were analyzed, and the results are tabulated in Table 2.

TABLE 2

Properties of metal-clad laminates

| | Unit | Metal-clad laminate 1 | 2 | 3 | 4 | 5 | 6 | Comparative metal-clad laminate 1 | 2 |
|---|---|---|---|---|---|---|---|---|---|
| Water absorption | % | 0.05 | 0.05 | 0.05 | 0.05 | 0.05 | 0.05 | 0.05 | 0.05 |
| Solder resistance | minute | >10 | >10 | >10 | >10 | >10 | 7 | >10 | >10 |
| Peeling strength | pound/inch | 4.4 | 3.4 | 4.3 | 4.3 | 4.3 | 4.4 | 4.5 | 3.0 |
| Tg | ° C. | 180 | 175 | 179 | 178 | 176 | 164 | 185 | 170 |
| Thermal expansion percentage | % | 2.6 | 2.6 | 2.6 | 2.7 | 2.7 | 3.3 | 2.5 | 2.8 |
| Flame retardance | UL grade | V0 | V0 | V0 | V0 | V0 | V1 | V0 | V0 |
| Df @ 10 GHz | | 3.92 | 3.81 | 3.82 | 3.82 | 3.82 | 3.82 | 3.97 | 3.72 |
| Dk @ 10 GHz | | 0.0074 | 0.0084 | 0.0079 | 0.0080 | 0.0080 | 0.0080 | 0.0070 | 0.0090 |
| Alkali resistance | | PASS | PASS | PASS | PASS | PASS | PASS | FAIL | PASS |
| Warpage | % | 13 | 1.2 | 1.9 | 1.8 | 1.7 | 1.2 | 32 | 0.5 |
| Wear percentage on the drill | % | 57 | 49 | 51 | 47 | 45 | 44 | 62 | 45 |

As shown in Table 2, the electronic material (i.e., metal-clad laminates 1 to 6) manufactured by using the resin compositions of the present invention are provided with satisfactory physicochemical properties and electrical properties (such as water absorption, flame retardance, Dk, and Df), and low warpage and wear percentage on the drill. In particular, when the weight ratio of the bismaleimide resin represented by formula (I) to the resin represented by formula (II) is 1:1 (i.e., Examples 3 to 6), the electronic material manufactured thereby can be provided with obviously better peeling strength and obviously lower warpage simultaneously. In addition, adding a moderate amount of core/shell rubber could further improve the warpage of the laminate and the wear percentage on the drill. However, adding too much core/shell rubber will deteriorate the thermal resistance, flame retardance, and dimensional stability of the electronic material.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
   (A) an epoxy resin, wherein the epoxy resin is selected from the group consisting of novolac epoxy resins, dicyclopentadiene (DCPD) epoxy resins, bisphenol epoxy resins, diphenylethylene epoxy resins, triazine skeleton-containing epoxy resins, fluorene skeleton-containing epoxy resins, triphenol methane epoxy resins, biphenyl epoxy resins, xylylene epoxy resins, biphenyl aralkyl epoxy resins, naphthalene epoxy resins, alicyclic epoxy resins, and combinations thereof;
   (B) a cross-linking agent, which comprises a styrene maleic anhydride (SMA) resin;
   (C) a bismaleimide resin (BMI) represented by the following formula (I):

formula (I)

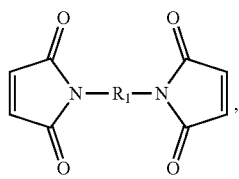

wherein $R_1$ is selected from the group consisting of methylene (—$CH_2$—), 4,4'diphenylmethane group

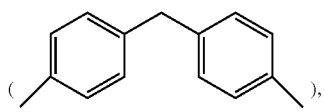

m-phenylene

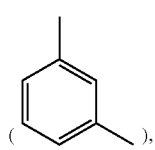

bisphenol A diphenyl ether group

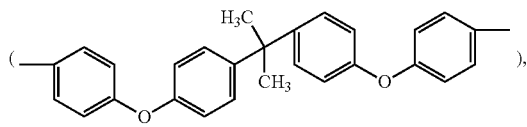

3,3'-dimethyl-5,5'-diethyl-4,4'-diphenylmethane group

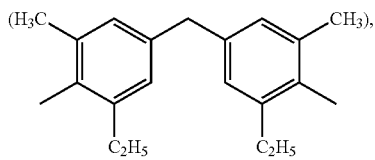

4-methyl-1,3-phenylene

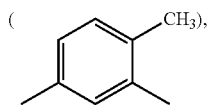

and (2,2,4-trimethyl) hexamethylene

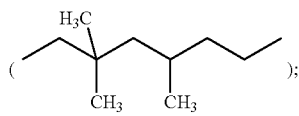

and
   (D) a resin represented by the following formula (II):

formula (II)

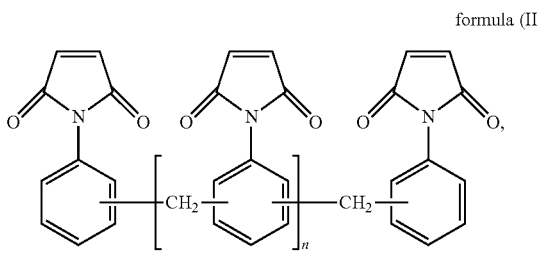

wherein n is an integer of 1 to 10,
and wherein based on the dry weight of the resin composition, the amount of the bismaleimide resin represented by formula (I) is about 16 wt % to about 35 wt %, and the amount of the resin represented by formula (II) is about 16 wt % to about 20 wt %,
based on the dry weight of the resin composition, the amount of the epoxy resin is about 1 wt % to about 20 wt %, and
based on the dry weight of the resin composition, the amount of the cross-linking agent is about 1 wt % to about 30 wt %.

2. The resin composition of claim 1, wherein the cross-linking agent further comprises one or more of styrene maleic anhydride (SMA) resins, cyanate ester resins, benzoxazine resins, phenolic novolac (PN) resins, dicyandiamide (Dicy), diaminodiphenyl sulfone (DDS), amino triazine novolac (ATN) resins, diaminodiphenylmethane, and styrene-vinyl phenol copolymers.

3. The resin composition of claim 2, further comprising a core/shell rubber.

4. The resin composition of claim 1, further comprising a core/shell rubber.

5. The resin composition of claim 1, further comprising a filler selected from the group consisting of silica, aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzs, diamonds, diamond-like carbon, graphites, calcined kaolin, pryan, micas, hydrotalcite, polytetrafluroroethylene (PTFE) powders, glass beads, ceramic whiskers, carbon nanotubes, nanosized inorganic powders, and combinations thereof.

6. The resin composition of claim 1, further comprising an additive selected from the group consisting of tougheners, flame retardants, catalysts, dispersing agents, and combinations thereof.

7. A prepreg, which is prepared by impregnating a substrate with the resin composition of claim 1 or by coating the resin composition of claim 1 onto a substrate and drying the impregnated or coated substrate.

8. A metal-clad laminate, which is prepared by laminating the prepreg of claim 7 with a metal foil.

9. A printed circuit board, which is prepared from the metal-clad laminate of claim 8.

10. A metal-clad laminate, which is prepared by coating the resin composition of claim 1 onto a metal foil and drying the coated metal foil.

11. A printed circuit board, which is prepared from the metal-clad laminate of claim 10.

* * * * *